United States Patent
Keller et al.

(10) Patent No.: US 9,097,759 B2
(45) Date of Patent: Aug. 4, 2015

(54) APPARATUS RELATED TO AN INDUCTIVE SWITCHING TEST

(75) Inventors: Daren W. Keller, Arundel, ME (US); John T. Andrews, Eagle Mountain, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 151 days.

(21) Appl. No.: 13/559,048

(22) Filed: Jul. 26, 2012

(65) Prior Publication Data

US 2013/0027825 A1    Jan. 31, 2013

Related U.S. Application Data

(60) Provisional application No. 61/513,454, filed on Jul. 29, 2011.

(51) Int. Cl.
   *G01R 31/00* (2006.01)
   *G01R 31/28* (2006.01)
   *G01R 1/36* (2006.01)

(52) U.S. Cl.
   CPC .............. *G01R 31/2879* (2013.01); *G01R 1/36* (2013.01)

(58) Field of Classification Search
   CPC ........... G01R 31/2621; G01R 31/2637; G01R 31/261; G01R 31/2831; G01R 31/025; G01R 31/327; G01R 31/26; G01R 31/04
   USPC ............ 324/762.08, 762.09, 762.01, 750.01, 324/500, 750.15, 555, 522
   See application file for complete search history.

(56) References Cited

U.S. PATENT DOCUMENTS

| | | | | |
|---|---|---|---|---|
| 4,851,769 A | * | 7/1989 | Carpenter et al. | 324/762.08 |
| 5,115,369 A | * | 5/1992 | Robb et al. | 361/58 |
| 6,208,185 B1 | * | 3/2001 | John et al. | 327/170 |
| 8,704,540 B2 | * | 4/2014 | Hashimoto | 324/750.01 |
| 2012/0153974 A1 | * | 6/2012 | Hashimoto | 324/750.01 |
| 2012/0182031 A1 | * | 7/2012 | Tokumoto et al. | 324/750.01 |
| 2013/0027067 A1 | * | 1/2013 | Schwartz et al. | 324/750.01 |

FOREIGN PATENT DOCUMENTS

WO    WO2011021076    * 2/2011

OTHER PUBLICATIONS

"Method 3470.2—Single Pulse Unclamped Inductive Switching", retrieved from http://www.everyspec.com, Nov. 29, 2010, 3 pages.
Turner, Allen E., "An Improved Detector Scheme for Nondestructive Reverse Bias Safe Operating Area Test Systems", IEEE Transactions on Instrumentation and Measurement, vol. 41, No. 5, Oct. 1992, 6 pages.
"Inductive Load Test Losses", Application Note, Integrated Technology Corporation, Nov. 5, 2004, 4 pages.
Phipps, John P. et al., "New Insights Affect Power MOSFET Ruggedness", IEEE, 1998, 9 pages.
(Continued)

*Primary Examiner* — Huy Q Phan
*Assistant Examiner* — Thang Le
(74) *Attorney, Agent, or Firm* — Brake Hughes Bellermann LLP

(57) ABSTRACT

In one general aspect, an apparatus can include an energy storage device configured to store energy during an unclamped inductive switching test of a target device, and a switch device configured to shunt at least a portion of energy away from the target device in response to the target device changing from a breakdown state to a failure state.

26 Claims, 10 Drawing Sheets

(56) References Cited

OTHER PUBLICATIONS

"Single-Pulse Unclamped Inductive Switching" A Rating System, AN-7514 Application Note, Fairchild Semiconductor Corporation, 2002, 4 pages.

"Unclamped Inductive Switching (UIS) Test and Rating Methodology", GWS, AN-2000-000-B, Mar. 13, 2007, 5 pages.

Pawel, I. et al., "Experimental study and simulations on two different avalanche modes in trench power MOSFETs", Power Semiconductors, IET Circuits Devices Syst., vol. 1, No. 5, Oct. 2007, 6 pages.

* cited by examiner

APPARATUS RELATED TO AN INDUCTIVE SWITCHING TEST

RELATED APPLICATION

This application claims priority to and the benefit of U.S. Provisional Patent Application Ser. No. 61/513,454, filed on Jul. 29, 2011, entitled, "Methods and Apparatus Related to an Inductive Switching Test," which is incorporated herein by reference in its entirety.

TECHNICAL FIELD

This description relates to an inductive switching test.

BACKGROUND

An unclamped inductive switching (UIS) test implemented by known test systems can be destructive to a device under test (DUT), devices near the device under test, and/or test equipment (e.g., test probes, test boards, test circuitry) associated with the device under test in the event that the device under test fails (e.g., fails catastrophically). In other words, using known test systems a device under test that fails a UIS test implemented by known test systems can be destroyed and/or can cause damage to adjacent (e.g., surrounding, relatively close proximity) devices and/or test equipment. Collateral damage caused to adjacent devices can, for example, result in lower wafer sort yields, and failing UIS events can result in transient power surges to test equipment when the device under test is shorted from, for example, electrical overstress. In addition, hardware limitations for known test systems can result in test conditions at wafer sort test (e.g., test currents at wafer sort) that can be mismatched with those used in package level testing and/or field use. This mismatch can result in unreliable devices being needlessly built into packages at a relatively large cost because the devices could not be effectively screened at wafer sort test. Thus, a need exists for systems, methods, and apparatus to address the shortfalls of present technology and to provide other new and innovative features.

SUMMARY

In one general aspect, an apparatus can include an inductive storage device configured to discharge at least a portion of energy stored in the inductive storage device into a target device during a wafer level reliability test. The apparatus can include a monitoring module configured to receive an indicator of a voltage across the target device as the energy is discharging from the inductive storage device into the target device, and a shunt controller configured to trigger shunting of at least a portion of the energy away from the target device in response to a condition being satisfied based on the indicator of the voltage.

In another general aspect, an apparatus can include an energy storage device configured to store energy during an unclamped inductive switching test of a target device, and a switch device configured to shunt at least a portion of energy away from the target device in response to the target device changing from a breakdown state to a failure state.

In yet another general aspect, a method can include discharging at least a portion of energy stored in an energy storage device into a target device during a wafer level reliability test, and monitoring an aspect of the target device as the energy is discharging from the energy storage device into the target device. The method can also include identifying a failure of the target device based on a behavior of the aspect of the energy satisfying a condition, and can include shunting at least a portion of the energy away from the target device in response to the identification of the failure.

In yet another general aspect, a tangible computer-readable medium can be configured to store instructions configured to cause a processor to execute a process that can include discharging at least a portion of energy stored in an energy storage device into a target device during a wafer level reliability test, and monitoring an aspect of the target device as the energy is discharging from the energy storage device into the target device. The process can also include identifying a failure of the target device based on a behavior of the aspect of the energy satisfying a condition, and can include shunting at least a portion of the energy away from the target device in response to the identification of the failure.

In yet another general aspect, a method can include sending energy from an energy storage device into a target device during a wafer level reliability test, and detecting, during the wafer level reliability test, that the target device is in a failure state based on a voltage across the target device. The method can also include decreasing a current through the target device in response to the detecting.

In yet another general aspect, a tangible computer-readable medium can be configured to store instructions configured to cause a processor to execute a process that can include sending energy from an energy storage device into a target device during a wafer level reliability test, and detecting, during the wafer level reliability test, that the target device is in a failure state based on a voltage across the target device. The process can also include decreasing a current through the target device in response to the detecting.

The details of one or more implementations are set forth in the accompanying drawings and the description below. Other features will be apparent from the description and drawings, and from the claims.

DETAILED DESCRIPTION

Figure 1:
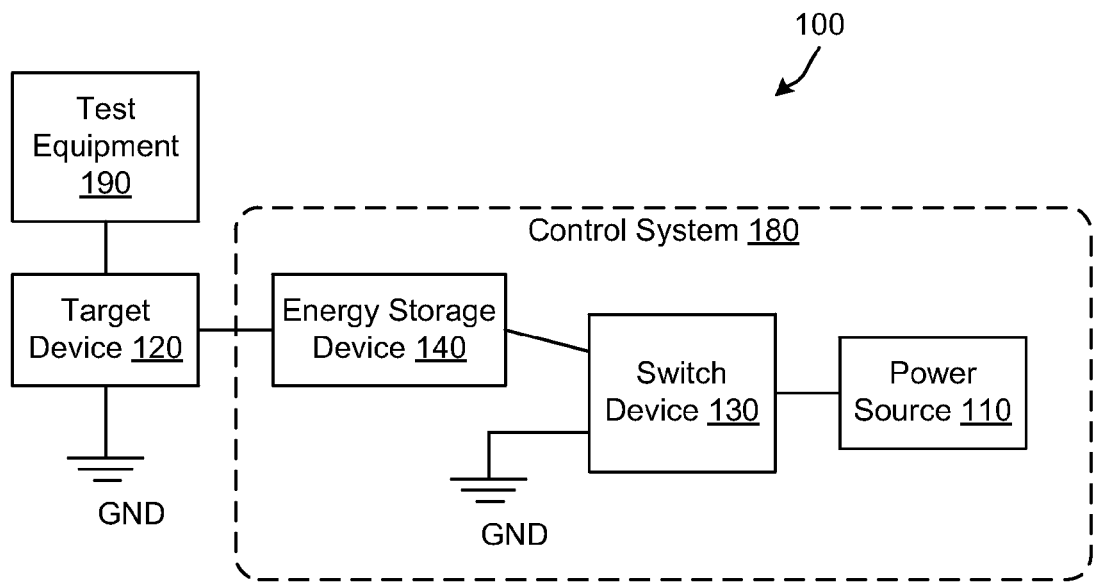
FIG. 1 is a block diagram that illustrates a test system for performing a reliability test on a target device, according to an embodiment.

FIG. 1 is a block diagram that illustrates a test system 100 for performing a reliability test (e.g., a wafer level reliability test) on a target device 120, according to an embodiment. In some embodiments, the reliability test can be, for example, an unclamped inductive switching (UIS) test, an avalanche test, an electrical overstress test, and/or so forth. In some embodiments, one or more reliability tests performed by the test system 100 can be configured to filter out (e.g., screen out) target devices (such as target device 120) that may have defects (e.g., inherent defects) that can result in a failure (e.g., a reliability failure, early failure). Target devices (e.g., target device 120) that fail a reliability test performed by the test system 100 may be discarded (or otherwise identified), and target devices that pass the reliability test may be packaged and sold (or otherwise identified). In some embodiments, the target device 120 can be referred to as a device under test (DUT). During a reliability test, such as, for example, a UIS test, the target device 120 can be stressed by a relatively high level of energy delivered to the target device 120. The delivery of the relatively high level of energy can stress the target device 120 and can be used to identify weaknesses in the target device 120.

The test equipment 190 and/or devices adjacent to (e.g., devices in relatively close proximity to) the target device 120 can be protected (or substantially protected) by the test system 100 by shunting energy (e.g., a portion of energy) away from the target device 120 in the event of a failure (or before failure) of the target device 120 during a reliability test performed by the test system 100. The shunting of energy away from the target device 120 in the event of a failure of the target device 120 can be performed by at least a portion of the control system 180. As shown in FIG. 1, the control system 180 includes an energy storage device 140, a switch device 130, and a power source 110.

Without the shunting capability provided by the control system 180, one or more reliability tests implemented by the test system 100 for the target device 120 (or another target device), in the event that the target device 120 fails, could be destructive to the target device 120, other devices (or other target devices) surrounding (e.g., near) the target device 120, and/or test equipment 190 (e.g., test probes, test boards, test circuitry) associated with the target device 120. In other words, a target device that fails a reliability test implemented by a test system without shunting capability (not shown) can be destroyed and can cause damage to adjacent (e.g., surrounding, relatively close proximity) devices and/or test equipment. Heat released from the target device, as it fails (e.g., electrically shorts when failing, fails short) during a reliability test implemented by the test system, for example, can compromise the integrity of one or more devices adjacent to the target device and/or a portion of the test equipment monitoring the target device. Damage caused to one or more adjacent devices in close proximity to the target device can result in a degraded reliability, or subsequent failure, of the one or more adjacent devices.

Using the test system 100 shown in FIG. 1, if the target device 120 produces, or is associated with, a high power transient event (e.g., a voltage spike, a current spike, a heat spike) related to a failure of the target device 120, portions of the test equipment 190 (e.g., test hardware, contacts, probe tips, circuitry, test contacts) coupled to (e.g., electrically coupled to) the target device 120 and/or other devices adjacent to the target device 120 can be protected by shunting energy (e.g., a portion of energy) away from the target device 120. Energy that might otherwise be directed to (and dissipated by) the test equipment 190 and/or devices adjacent to the target device 120 via the target device 120 in the event of a failure can instead be dissipated (e.g., safely dissipated) by the test system 100. As a specific example, the test system 100 can be configured to shunt current from the target device 120 that fails (or before failing) UIS testing using the test system 100 to mitigate the damaging effects of the UIS testing to adjacent devices and/or to the test equipment 190 in the event that the target device 120 fails. In some embodiments, the test system 100 can be configured to shunt current from the target device 120 that fails (or before failing) UIS testing using the test system 100 at a current level (e.g., current limit) that is below a current level (e.g., a current limit, a current rating) of a probe included in test equipment 190 (in the event that the target device 120 fails). In some embodiments, damage to the target device 120 can also be reduced (e.g., minimize) by shunting energy away from the target device 120.

Because the test system 100 is configured to shunt energy away from the target device 120, reliability testing can be performed under more stressful conditions (e.g., at higher currents (e.g., >50 A)) than could otherwise be implemented without shunting capability. For example, reliability testing at wafer final test (e.g., wafer level reliability testing) can be performed by a test system with shunting capability at higher currents than could be possible in a similar test system without shunting capability. Specifically, a test system without shunting capability may implement testing at relatively low energy conditions so that failure of a target device may not result in damaging levels of energy to be absorbed by the test system (e.g., a probe of the test system) in the event of failure of the target device. A test system with shunting capability may implement testing at relatively high energy conditions without the possibility of the test system absorbing damaging levels of energy because the relatively high energy (or a portion thereof) will be handled in a desirable fashion by shunting the relatively high energy (or a portion thereof) in the event of failure of a target device.

In this embodiment, the control system 180 is configured to operate in conjunction with the test equipment 190 to perform a reliability test in multiple stages (or portions of a reliability test). During a storage portion of a reliability test performed by the test system 100, the target device 120 is coupled to a power source 110 of the control system 180 configured to deliver energy (e.g., power) to an energy storage device 140 of the control system 180 where energy is stored (e.g., temporarily stored). The energy is delivered via a switch device 130 of the control system 180 (which can be in an on-state or closed state) and flows through the target device 120 (which can be in an on-state or conducting state) to ground GND. The switch device 130 can be configured to convey the energy produced by the power source 110 to the energy storage device 140 and the energy (or a portion thereof) can flow through the target device 120 to ground.

During a stress portion of the reliability test, energy is delivered from the energy storage device 140 to the target device 120 when the target device 120 is turned off. The energy, rather than being stored in the energy storage device 140, is delivered (e.g., discharged) from the energy storage device 140 to the target device 120. In some embodiments, the target device 120 can be changed to, for example, a stressed state (e.g., a breakdown state) in response to energy being delivered from the energy storage device 140 to the target device 120. One or more parameters associated with the target device 120 can be monitored during the stress portion of the reliability test. In some embodiments, during the stress portion of the reliability test, the target device 120 can be changed from an on-state to an off-state (e.g., an inactive state, a non-conducting state). In some embodiments, the stress portion of the reliability test can be triggered when the target device 120 is changed from the on-state to the off-state (e.g., an inactive state, a non-conducting state).

Also, during the stress portion of the reliability test, the energy being delivered to the target device 120 is shunted away from the target device 120 when one or more parameters of the target device 120 satisfy one or more conditions (e.g., threshold conditions). For example, during the stress portion of the reliability test, energy being delivered to the target device 120 can be redirected (e.g., shunted) if the target device 120 changes to a failed state (e.g., a shorted state). In other words, during the stress portion of the reliability test, energy being delivered to the target device 120 can be redirected (e.g., shunted) if the target device 120 fails. For example, the energy being delivered to the target device 120, or a portion thereof, can be redirected to a path parallel to the target device 120 (where the energy can be dissipated in a desirable fashion) in the event that the target device 120 fails during, for example, UIS screening.

The changing of the target device 120 to the failed state can be identified based on one or more parameters of the target device 120 satisfying one or more conditions. For example, in some embodiments, the target device 120 can be identified as changing to (or being in) a failed state if a voltage across target device 120 fails to exceed a threshold voltage (e.g., a target breakdown voltage, an expected breakdown voltage, a rated breakdown voltage, a threshold voltage value) and/or a current through the target device 120 fails to exceed a threshold current (e.g., a threshold current value). In some embodiments, the target device 120 can be identified as changing to (or being in) the failed state if the threshold voltage and/or the threshold current are not exceeded within a specified (e.g., predefined) time period. In some embodiments, the target device 120 can be identified as changing to (or being in) a failed state if a voltage across the target device 120 falls below a threshold voltage and/or a current through the target device 120 falls below a threshold current. In some embodiments, the target device 120 can be identified as changing to (or being in) the failed state if the threshold voltage and/or the threshold current is crossed within a specified (e.g., predefined) time period. In some embodiments, the target device 120 can be identified as failing if the voltage across the target device 120 rises above a certain level during charging of the energy storage device 140. More details related to different events and/or conditions that can trigger shunting of energy away from the target device 120 are described below.

In some embodiments, a leakage current screen can be performed before or after the reliability testing (e.g., UIS testing) as described herein. For example, the leakage current screening can be performed to identify one or more target devices that are susceptible to failure before implementing the reliability testing described herein. As another example, leakage screening can be performed after the reliability testing described herein to verify whether or not a device (e.g., a passing device) has been damaged or is robust (e.g., reliable based on passing a reliability test criteria) after the reliability testing described herein has been implemented.

In some embodiments, the target device 120 can be a semiconductor device such as, for example, a metal-oxide-semiconductor field-effect transistor (MOSFET) device (e.g., a power MOSFET device), an insulated gate bipolar transistor device (IGBT device), a bipolar junction transistor (BJT) device, and/or so forth. In some embodiments, the target device 120 can include a collection of devices. In some embodiments, the target device 120 can be included in a semiconductor wafer (e.g., in a wafer form) with several other devices (e.g., MOSFET devices, bipolar junction transistor (BJT) devices). Accordingly, the reliability test described above can be performed at, for example, wafer sort test (before being cut into die and/or integrated into discrete modules). In some embodiments, the target device 120 can be a MOSFET device configured for use in a multi-chip module.

In some embodiments, the switch device 130 can include any type of circuitry configured to direct energy for storage in the energy storage device 140 during an energy storage portion of a reliability test, and shunt energy away from the target device 120 during a stress portion of the reliability test in the event of a failure of the target device 120. In some embodiments, the switch device 130 can include one or more MOSFET devices, a silicon controlled rectifier (SCR), logic circuitry, resistors, comparators, and/or so forth.

In some embodiments, the power source 110 can be any type of power source such as, for example, a switched mode power supply, a direct-current (DC) power supply, an alternating-current (AC) power supply, and/or so forth. In some embodiments, the power source 150 can include a power source that can be any type of power source such as, for example, a direct current (DC) power source such as a battery, a fuel cell, and/or so forth. In some embodiments, the power source 110 can be configured to provide energy for storage in the energy storage device 140 via one or more pulses, in a continuous fashion, and/or so forth. More details related to the test system 100 shown in FIG. 1 are described below.

Figure 2:
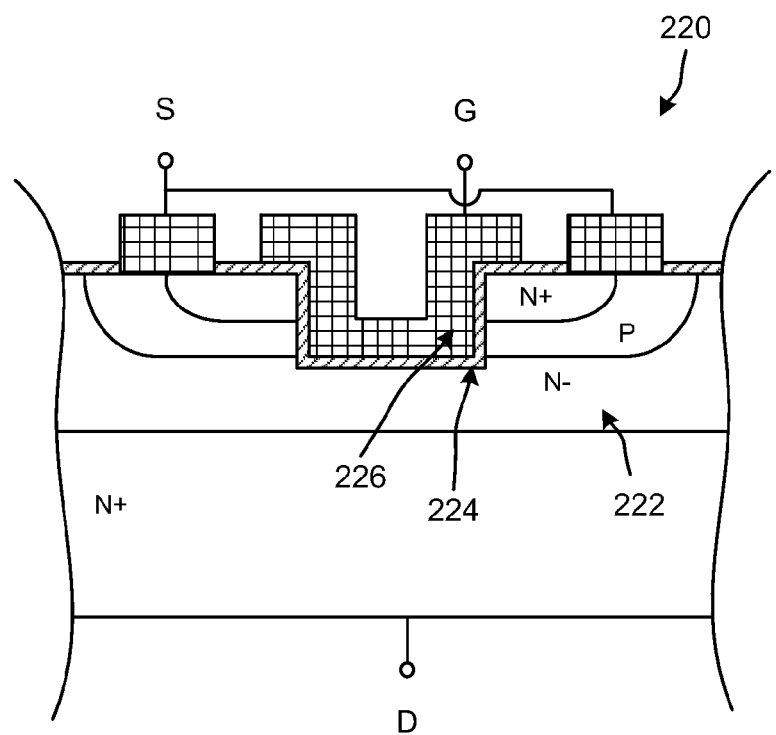
FIG. 2 is a schematic diagram that illustrates a metal-oxide-semiconductor field-effect transistor (MOSFET) device configured to be tested within the test system shown in FIG. 1, according to an embodiment.

FIG. 2 is a schematic diagram that illustrates a MOSFET device 220 configured to be tested within the test system 100 shown in FIG. 1, according to an embodiment. Specifically, the MOSFET device 220, which is a vertically oriented MOSFET device, shown in FIG. 2 can be a target device (e.g., target device 120) configured to be tested within the test system 100.

As shown in FIG. 2, the MOSFET device 220 includes a gate G, a source S, and a drain D. Defects in the MOSFET device 220 can be identified using the test system 100. For example, defects included in a gate electrode 226 (e.g., a polysilicon gate electrode) of the MOSFET device 220, defects included in a gate dielectric 224 (e.g., a gate oxide), and/or so forth can be identified. In some embodiments, the defects, or other irregularities in the MOSFET device 220, can cause, for example, a latch-up induced failure of the parasitic bipolar junction transistor (BJT) 222 included in the MOSFET device 220. In some embodiments, failures of the MOSFET device 220 (or another type of target device) can be caused by, for example, a blocked contact, a blocked implant, a high resistance contact, portions of un-etched trenches or partially etched trench resulting in localized low breakdown voltage (BVDSS), a high resistance heavy body contact, and/or so forth.

Figure 3:
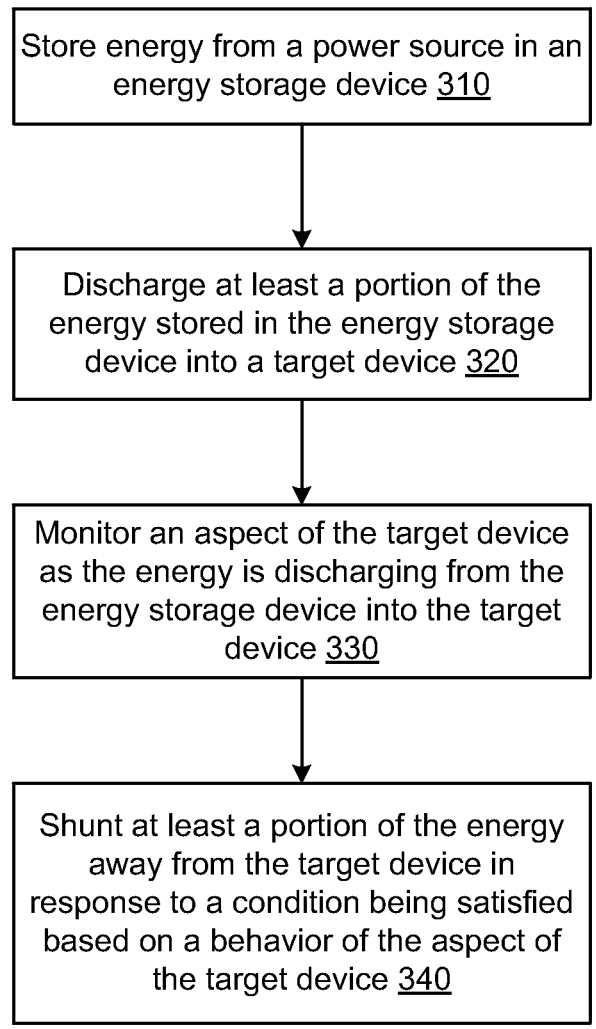
FIG. 3 is a flowchart that illustrates a method for operating a test system, according to an embodiment.

FIG. 3 is a flowchart that illustrates a method for operating a test system, according to an embodiment. In some embodiments, the method shown in FIG. 3 can be used to operate the test system 100 shown in FIG. 1. The method shown in FIG. 3 can be associated with a reliability test (e.g., a UIS test), and can be performed on a target device included in a wafer at, for example, wafer sort test before the target device is cut out of the wafer into a die.

As shown in FIG. 3, energy is stored from a power source in an energy storage device (block 310). The energy storage device can be, for example, energy storage device 140 shown in FIG. 1. In some embodiments, the energy storage device 140 can be, for example, an inductor, a battery, and/or so forth. When the energy storage device is an inductor or inductive-type device, the energy storage device can be referred to as an inductive storage device. Energy can be stored in the energy storage device via a switch device (e.g., switch device 130 shown in FIG. 1). In some embodiments, at least a portion of the energy can flow through a target device (e.g., target device 120 shown in FIG. 1). The energy can be delivered from the power source (e.g., power source 110 shown in FIG. 1) and stored in the storage device during an energy storage portion of a reliability test.

At least a portion of the energy stored in the energy storage device is discharged into the target device (block 320). The target device can be, for example, target device 120 shown in FIG. 1. In some embodiments, the target device can be, for example, a MOSFET device included in a wafer. In some embodiments, the energy stored in the energy storage device can be discharged into the target device in response to the power source terminating delivery of power to the energy storage device, in response to the power source being electrically decoupled, in response to the target device changing from an on-state to an off-state, and/or so forth. In some embodiments, the discharging of at least a portion of the energy stored in the energy storage device into the target device can be triggered (e.g., commenced, initiated) at the beginning of a stress portion of a reliability test.

An aspect of the target device is monitored as the energy is discharging from the energy storage device into the target device (block 330). In some embodiments, the target device can be monitored, for example, by the test equipment 190 shown in FIG. 1. In some embodiments, the aspect can be a voltage and/or a current of the target device monitored (e.g., measured) as the energy is discharging from the energy storage device into the target device during a stress portion of a reliability test. An indicator of the aspect or monitoring (e.g., a voltage value, a current value) can be received by, for example, a portion of a controller (not shown) included in the control system 180.

In some embodiments, one or more of the operations described above in connection with FIG. 3 can be performed using software stored in a computer-readable medium (e.g., a tangible computer-readable medium). More details related to a controller included in a control system are described in connection with, for example, FIG. 4.

At least a portion of the energy is shunted away from the target device in response to a condition being satisfied based on a behavior of the aspect of the target device (block 340). For example, in some embodiments, if a voltage across the target device is above a threshold voltage for less than a threshold period of time (e.g., duration, a predefined period of time), at least a portion of the energy can be directed away (e.g., redirected) from the target device. This can occur when the voltage across at least a portion of a device under test (e.g., target device) collapses (e.g., abruptly falls) before discharging of, for example, energy from an inductive storage device has been completed. As another example, in some embodiments, if a voltage across the target device remains below a threshold voltage for greater than a threshold period of time (e.g., duration), at least a portion of the energy can be directed away (e.g., redirected) from the target device. This can occur, for example, when a device under test (e.g., a target device) fails to turn off (e.g., fully turn off) because a parasitic bipolar junction transistor (BJT) within the device under test has latched up. In such instances, the voltage across the device under test may not exceed a predetermined (or threshold) value within a time interval after the device under test is turned off (e.g., gate is turned off). In some embodiments, the shunting can be performed so that a portion of the energy is dissipated in a device (e.g., a silicon-controlled rectifier (SCR) device) instead of being dissipated through the target device. In some embodiments, the device through which energy is dissipated can be referred to as an energy dissipation device. As another example, in some embodiments, if the voltage across the target device fails to rise above a threshold voltage during the stress portion of the reliability test, the portion of the energy can be shunted away from the target device (and into a load).

In some embodiments, the shunting associated with block 340 can include identifying a failure of the target device based on a behavior of the aspect of the energy satisfying a condition, and shunting at least a portion of the energy away from the target device in response to the identification of the failure. In some embodiments, the identification of the failure based on the condition can be performed by, for example, a portion of a controller (not shown) included in the control system 180. In some embodiments, the shunting can be triggered by, for example, a portion of a controller (not shown) included in the control system 180. More details related to a controller included in a control system 180 are described in connection with, for example, FIG. 4 below.

Figure 4:
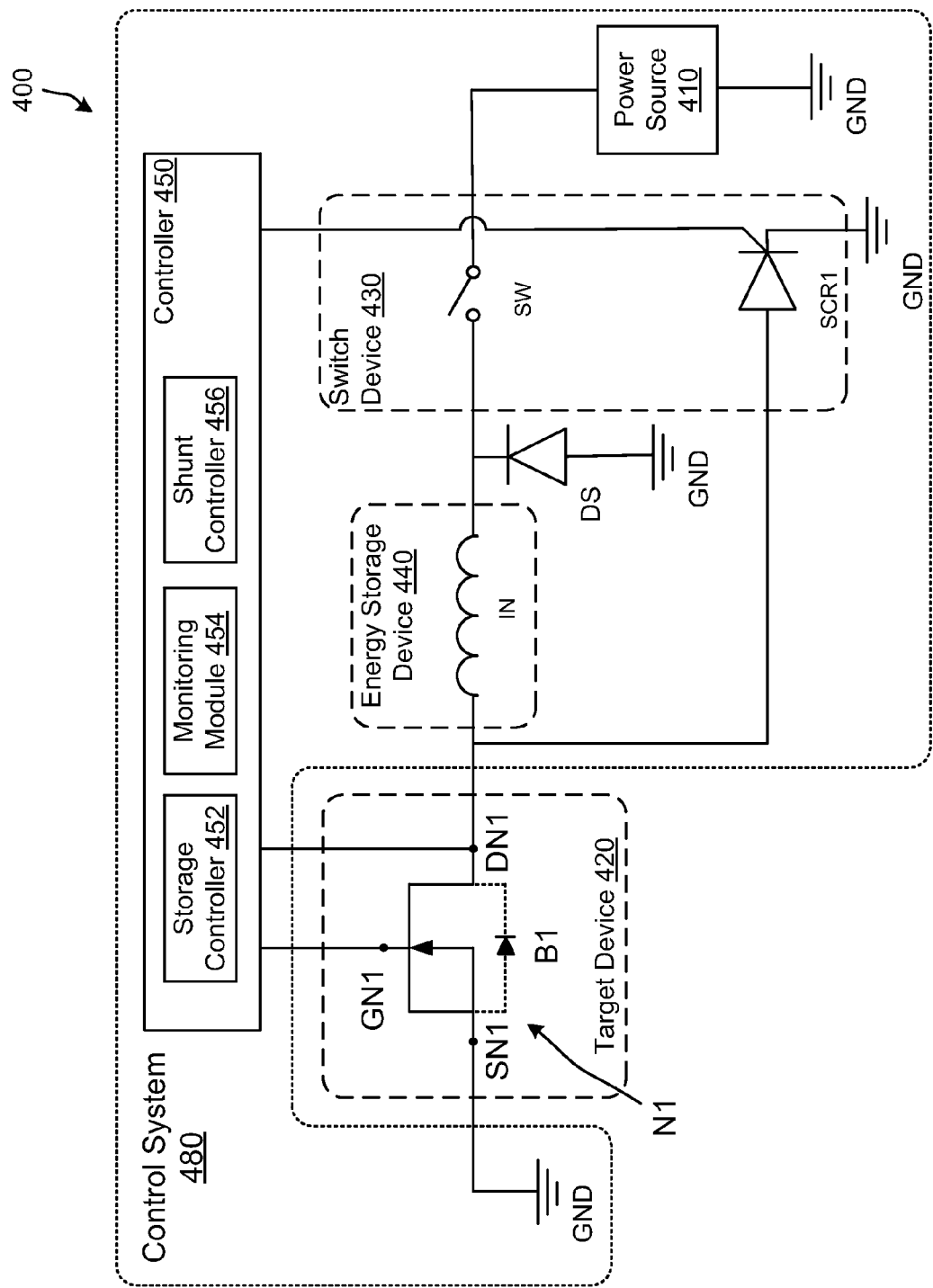
FIG. 4 is a diagram that illustrates a test system coupled to a target device.

FIG. 4 is a diagram that illustrates a test system 400 coupled to a target device 420. As shown in FIG. 4, the test system 400 includes a power source 410, a switch device 430, an energy storage device 440 (e.g., an inductive storage device), and a controller 450. In some embodiments, the power source 410, the switch device 430, the energy storage device 440, and the controller 450 can collectively define at least a portion of a control system 480 of the test system 400. As shown in FIG. 4, the controller 450 includes a storage controller 452, a monitoring module 454, and a shunt controller 456. In this embodiment, coupling of test equipment to the target device 420 is not shown. In some embodiments, at least a portion of the controller 450 can be included in test equipment and/or can be configured to interface with test equipment configured to implement a reliability test associated with the target device 420.

In this embodiment, the energy storage device 440 includes an inductor IN. The switch device 430 includes a switch SW and a silicon-controlled rectifier (SCR) device SCR1. In this embodiment, the switch SW is shown in an open configuration, however, the switch SW can be changed to a closed configuration. The target device 420 is a MOSFET device N1 (e.g., a power MOSFET device) that has a source node SN1, a drain node DN1, and a gate node GN1. A body diode of the target device 420 is modeled as body diode B1 within the MOSFET device N1.

In this embodiment, a reliability test can be applied to the MOSFET device N1 (which is the target device 420) by the test system 400 to determine whether or not the MOSFET device N1 has one or more defects that can result in (or has probability of resulting in) a reliability failure. The test system 400 can be configured to determine a capability of the MOSFET device N1 or IGBT to withstand breakdown (e.g., avalanche breakdown) while turning off with an unclamped inductive load (i.e., inductor IN) under a variety of conditions. In some embodiments, a variety of inductor sizes and/or current levels can be used to test the target device 420. In some embodiments, inductor size and/or current levels can be varied (e.g., varied incrementally up or down) during test cycles of a reliability test until the target device 420 fails. For example, inductor size can be held constant while current levels are varied during test cycles or a current level can be held constant while inductor sizes are varied during test cycles. In some embodiments, inductor size and current level can be varied during test cycles.

In some embodiments, the capability of the MOSFET device N1 can be a function of a peak drain current at turn-off of the MOSFET device N1 and the circuit inductance. In some embodiments, the target device 420 can be stressed during multiple test cycles using a single inductor (with a single inductor value) at a variety of currents. Using this method, the peak drain current capability of the MOSFET device N1 can be determined. In this embodiment, the energy stored in the inductor IN is directed through the MOSFET device N1 (without a voltage clamping circuit) so that energy stored in the inductor IN may be dissipated in the MOSFET device N1 at turn-off of the MOSFET device N1.

In some embodiments, the reliability test(s) implemented by the test system 400 may or may not represent actual application conditions where temperatures of the MOSFET device N1 can approach maximum rated values. In some embodiments, one or more reliability tests implemented by the test system 400 for the MOSFET device N1 can be repeated at various frequencies (e.g., a frequency of 10 kilohertz (kHz), 100 kHz). In some embodiments, voltage and/or current transients associated with one or more reliability tests implemented by the test system 400 may have durations of approximately between a few microseconds and a few seconds. In some embodiments, reliability defects in target devices (such as the MOSFET device N1) can be identified when the target devices are tested for avalanche operation under defined circuit conditions at relatively low repetition rates (e.g., frequencies) and/or at ambient room temperatures.

In this embodiment, the control system 480 is configured to operate in conjunction with the test equipment (not shown) to perform a reliability test in multiple stages (or portions of a reliability test). During a storage portion of a reliability test performed by the test system 400, a power source 410 is configured to deliver energy (e.g., power) to an energy storage device 440 (e.g., inductive storage device), where energy is stored, while the target device 420 is in an on-state (e.g., a conducting state, an active state). The energy is delivered via the switch SW, which can be in a closed or shorted configuration. In other words, the MOSFET device N1 (while the MOSFET device N1 is in an on-state) and the switch device 430 can be configured to define at least a portion of a circuit through which energy produced by the power source 410 can be delivered to the energy storage device 440.

In some embodiments, the switch SW can be changed to (and/or maintained in) the closed configuration and the MOSFET device N1 can be changed to (and/or maintained in) an on-state by the controller 450 (e.g., logic of the controller 450). Specifically, the switch SW can be triggered by the storage controller 452 of the controller 450 to close so that energy can be delivered from the power source 410 to the energy storage device 440.

After the energy storage device 440 has stored (or has been charged to) a specified level of energy (e.g., a threshold level of energy, a predefined level of energy), at least a portion of the energy stored in the energy storage device 440 can be delivered from (e.g., discharged from) the energy storage device 440 into the MOSFET device N1 during a stress portion of the reliability test. In other words, delivery of energy to the energy storage device 440 can be terminated when the energy storage device 440 is at a particular energy storage state so that the energy delivered to the energy storage device 440 can be released into the MOSFET device N1. In some embodiments, the energy storage device 440 can be monitored by the controller 450 so that delivery of energy from the power source 410 to the energy storage device 440 can be terminated by the controller 450 based on, for example, an energy state of the energy storage device 440. Specifically, the switch SW can be triggered by the storage controller 452 of the controller 450 to open so that energy is no longer delivered from the power source 410 to the energy storage device 440.

In some embodiments, while the switch SW is open and the energy storage device 440 discharges, the diode DS can conduct. In some embodiments, the switch SW can be closed during discharge of the energy storage device 440 to increase the energy delivered to the target device 420 by also simultaneously delivering energy from the power source 410 compared with the switch SW being open during discharge of the energy storage device 440 (in which case energy will not also be delivered from the power source 410).

As energy is being delivered from the energy storage device 440 to the MOSFET device N1, the body diode B1 of the MOSFET device N1 will be reverse-biased and will be in a breakdown state. In some embodiments, the MOSFET device N1 can be triggered to change into a drain-to-source avalanche breakdown state in response to an electromagnetic force (EMF) produced by the inductor IN as the inductor IN changes from an energy storage mode to an energy delivery (e.g., discharge) mode. In some embodiments, the MOSFET device N1 can be changed to an off-state (e.g., a non-conducting state) before, or as, energy is being delivered from the energy storage device 440 to the MOSFET device N1. In some embodiments, a voltage across the body diode B1, as measured (e.g., monitored) between the source node SN1 and the drain node DN1 of the MOSFET device N1, can be between approximately a few volts (e.g., 5 V, 20 V) and more than 100 V (e.g., 120 V, 140 V). The delivery (e.g., discharge) of energy into the MOSFET device N1 to reverse bias the body diode B1 can stress the MOSFET device N1 and can be used to identify defects in the MOSFET device N1 in the event that the MOSFET device N1 fails (e.g., fails short). In other words, energy delivered into the MOSFET device N1 can cause the body diode B1 to be in an avalanche state (e.g., reverse-biased mode). Failure of the MOSFET device N1 while the body diode B1 is in an avalanche state can be an indicator of one or more defects (e.g., a defect that could result in a reliability failure) in the MOSFET device N1. In some embodiments, the voltage across the body diode can be between approximately the rated breakdown voltage of the MOSFET device N1 and up to approximately two times the rated breakdown voltage (during a reliability test). In some embodiments, the voltage across the body diode can be approximately 1.3 times the rated breakdown voltage of the MOSFET device N1 (during a reliability test).

In this embodiment, a drain voltage of the MOSFET device N1 can be monitored by (e.g., monitored using a Kelvin sense circuit, monitored using a four-point probe, or monitored at the inductor) the controller 450 at drain node DN1 of the MOSFET device N1 as the energy is being delivered from the energy storage device 440 to the target device 420. In some embodiments, an indicator of the drain voltage (or another parameter such as a current) can be received by the monitoring module 454 of the controller 450. In some embodiments, the one or more measurements can be performed by test equipment (not shown) and represented as indicators of, for example, voltage and/or current that can be received by the monitoring module 454.

If the drain voltage of the MOSFET device N1 satisfies a condition (e.g., rapidly drops at a specified (e.g., predefined) rate or below a specified (e.g., predefined) level)) that indicates that the MOSFET device N1 has failed, the energy being delivered to the target device 420 can be shunted away from the target device 420 via the SCR device SCR1. In such embodiments, the controller 450 can be configured to trigger the SCR device SCR1 to shunt current from the energy storage device 440 to ground GND. Specifically, in some embodiments, the shunt controller 456 of the controller 450 can be configured to trigger the SCR device SCR1 to shunt current from the energy storage device 440 to ground GND. In some embodiments, when current is being shunted away from the target device 420 via the SCR device SCR1, the switch SW can be opened (e.g., opened by the controller 450). In some embodiments, the satisfying or non-satisfying of one or more conditions can be identified (e.g., determined, calculated) by the shunt controller 456. In some embodiments, one or more conditions can be designed into (e.g., coded within) a circuit (e.g., an analog circuit, a digital circuit) of the controller 450 or can be stored in, for example, a memory (not shown) where the conditions can be accessed or used during operation of the test system 400.

By shunting current away from the target device 420 other devices that may be integrated into a wafer with the target device 420 may be protected. For example, by shunting current away from the target device 420 heat that would be generated at the target device 420 by current through the target device 420 and that can cause damage to other devices integrated into a wafer with the target device 420 may not be generated. Also, heat, energy, and/or so forth that can cause damage to test equipment (not shown), which may be coupled to the target device 420 during the reliability test, may be directed away from the test equipment.

The operation of the test system 400 in FIG. 4, in some embodiments, can also be summed up as follows. The controller 450 can be configured to turn on the target device 420 and the switch SW simultaneously until the peak current value (e.g., predetermined peak current value) is reached, and then turn off the target device 420 and switch SW simultaneously. While the switch SW is on, current can flow through the inductor IN and the target device 420 from the power source 410 to charge-up the inductor IN. When the switch SW opens, current flows through a series loop including the inductor IN, the target device 420, and the diode DS. Because the target device 420 is turned off during current discharging and the inductor IN is forcing current as its magnetic field is collapsing, the voltage of the target device 420 increases to its avalanche value while the inductor IN discharges. The energy stored in the inductor IN is mostly dissipated in the target device 420, raising the temperature of the target device 420. If the junction temperature rises to a critical value, then the silicon of the target device 420 may no longer support avalanche voltage, and the voltage across the target device 420 will collapse. This effect can further heat one or more relatively small failure areas within the target device 420 and can create a melted spot, destroying the target device 420. For latch-up failures, the target device 420 can have a small portion of the target device 420 fail immediately upon gate turn-off. The shunt mechanism of the test system 400 shunts current away so that the energy of the inductor IN may be prevented (or substantially prevented) from dissipating in this small portion of the target device 420, to create additional damage (e.g., a larger melted area, a larger melted area that can affect neighboring devices).

Although FIG. 4 is illustrated with a MOSFET device as the target device 420. In some embodiments, other types of devices such as IGBT devices can be tested for reliability issues (or potential reliability issues) using the test system 400 in a similar fashion. Also, in this embodiment, the switch device 430 includes a switch SW and an SCR device SCR1. In some embodiments, the switch device 430 can include different devices (e.g., MOSFET devices, BJTs, operational amplifiers) than those shown in FIG. 4. For example, a device other than SCR device SCR1 may be used to shunt energy away from the target device 420. In some embodiments, a MOSFET device can be used, in lieu of, or in addition to the SCR device SCR1. In some embodiments, a BJT device can be used, in lieu of, or in addition to the SCR device SCR1. In some embodiments, a IGBT device can be used, in lieu of, or in addition to the SCR device SCR1.

In some embodiments, at least some components of the controller 450 can be hardware-based and/or software-based. In some implementations, one or more portions of the components shown in the controller 450 can be, or can include, a hardware-based module (e.g., a digital signal processor (DSP), a field programmable gate array (FPGA), a memory), a firmware module, and/or a software-based module (e.g., a module of computer code, a set of computer-readable instructions that can be executed at a computer). For example, in some implementations, one or more portions of the components of the controller 450 can be, or can include, a software module configured for execution by at least one processor (not shown). In some implementations, the functionality of the components can be included in different modules and/or different components than those shown in the controller 450.

Figure 5:
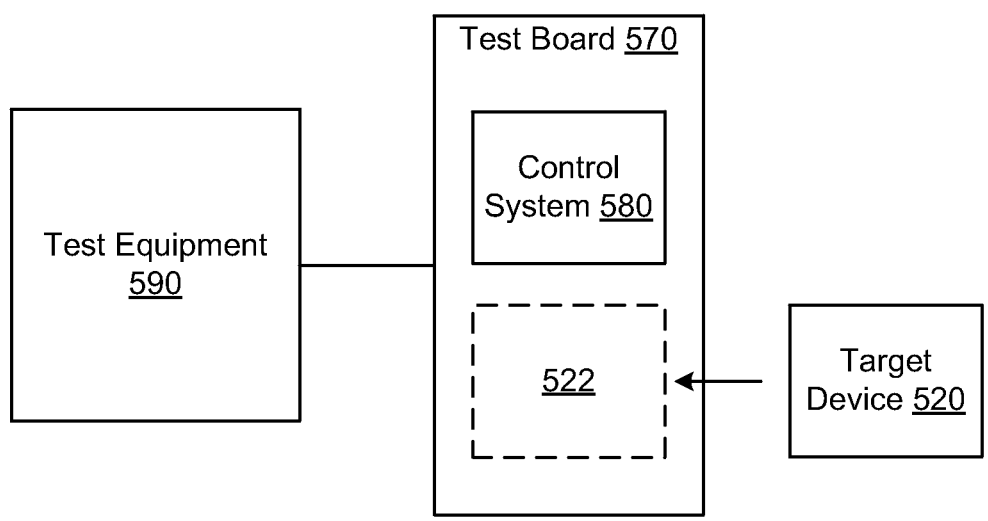
FIG. 5 is a diagram that illustrates a control system included in a test board.

FIG. 5 is a diagram that illustrates a control system 580 (similar to control system 480 shown in FIG. 4) included in a test board 570. The test board 570 can include a socket 522 configured to receive a target device 520. As shown in FIG. 5, the test board 570 can be associated with test equipment 590. In some embodiments, at least a portion of the control system 580 is included in the test board 570, and another portion of the control system 580 can be included outside of (e.g., in a device outside of) the test board 570. In some embodiments, the control system 580, or portions thereof, can be included in different devices than those shown in FIG. 5. For example, the control system 580, or portions thereof, can be incorporated into a stand-alone device that can interface with one more testers, handlers, etc.

FIGS. 6 through 8 are diagrams that illustrate operation of the test system 400 shown in FIG. 4, according to various embodiments. In some embodiments, FIGS. 6 through 8 can illustrate operation of, for example, a test system 100 shown in FIG. 1, test system 400 shown in FIG. 4, and so forth. In FIGS. 6 through 8, time is increasing to the right.

Although the behavior of the components described in connection with FIGS. 6 through 8 are described as, for example, making transitions at specified voltages, currents, and/or at specified times, when implemented (e.g., implemented using semiconductor devices), the transitions of the components may occur slightly before or slightly after the specified voltages, currents, and/or specified times. Specifically, variations in breakdown voltages, thermal conductivity, processing variations, temperature variations, switching times of devices, circuit transition delays, and/or so forth can result in conditions (e.g., non-ideal conditions) that can trigger transitions of components slightly before or slightly after the voltages, currents, and/or times in FIGS. 6 through 8.

FIGS. 6A through 6G are graphs that illustrate operation of the test system 400 shown in FIG. 4 when the target device 420 passes a reliability test implemented by the test system 400. A storage portion of the reliability test is performed before time Q2 and a stress portion of the reliability test is performed after time Q2. FIGS. 6A through 6G can illustrate, or be related to, a single cycle (e.g., a test cycle) of the reliability test.

Figure 6A:
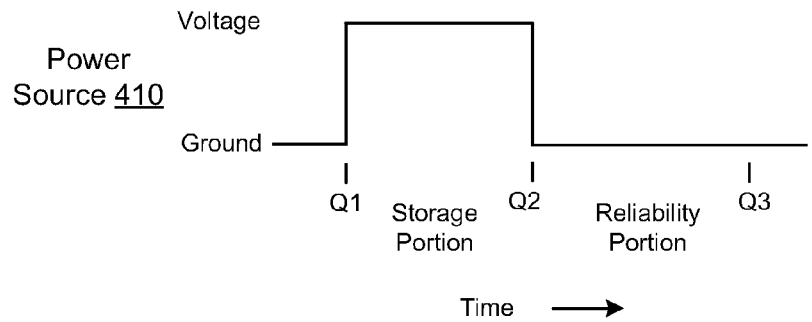
FIGS. 6A through 6G are graphs that illustrate operation of the test system shown in FIG. 4, according to an embodiment.
Figure 6B:
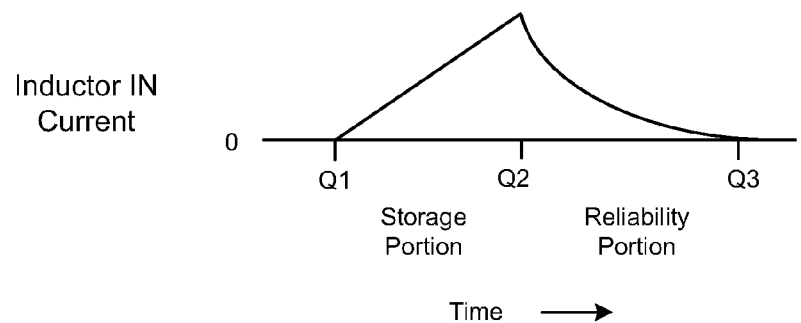
Figure 6C:
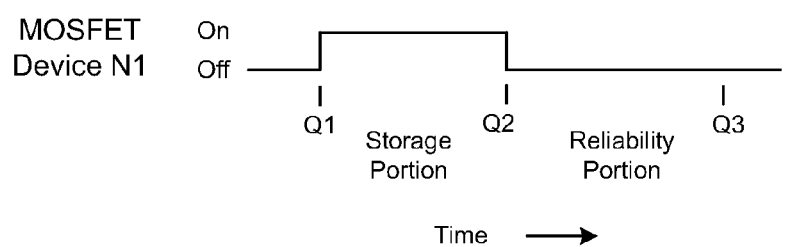
Figure 6D:
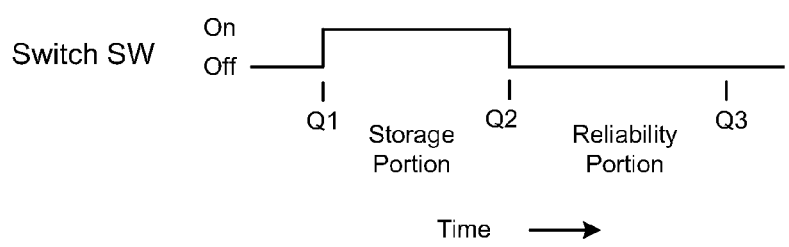

As shown in FIG. 6A, the power source 410 is configured to deliver, in conjunction with the switch SW shown in FIG. 6D, power starting at time Q1 and ending at time Q2. FIG. 6A illustrates a voltage (e.g., a voltage pulse) from the power source 410 (which can produce a voltage (e.g., a constant voltage, a relatively constant voltage) during the entire test cycle) shown at the output of the switch SW. In response to the voltage pulse, current stored in the inductor IN increases approximately linearly starting at time Q1 until approximately the end of the voltage pulse at time Q2 as shown in FIG. 6B. In other words, current is stored in the inductor IN between times Q1 and Q2 during the storage portion of the reliability test. In some embodiments, current may be stored in the inductor IN using energy having a different profile than the voltage pulse shown in FIG. 6A. In some embodiments, the ground voltage can be zero volts.

As shown in FIGS. 6C and 6D, the MOSFET device N1 and the switch SW, respectively, are changed from an off-state (e.g., an inactive state, an open state) to an on-state (e.g., an active state, an closed state) at approximately time Q1. Both the MOSFET device N1 and the switch SW are changed from an off-state to an on-state so that energy (e.g., associated with a voltage pulse) from the power source 410 (shown in FIG. 6A) may be delivered to the inductor IN (shown in FIG. 6B). The switching can be implemented by (e.g., triggered by) the controller 450.

Starting at approximately time Q2, current that was stored in the inductor IN during the storage portion of the reliability test is delivered from the inductor IN to the MOSFET device N1 during the stress portion of the reliability test. Accordingly, as shown in FIG. 6B, the current of the inductor IN decreases starting at approximately time Q2 until the current stored in the inductor IN is depleted (e.g., discharged, entirely depleted or discharged) at approximately time Q3.

As shown in FIG. 6C, at approximately time Q2, the MOSFET device N1 is changed from the on-state to an off-state. Current that was delivered to the inductor IN and stored in the inductor IN will be delivered to the MOSFET device N1 while the MOSFET device N1 is in an off-state. In such embodiments, the voltage across the inductor IN may be changed between a charging voltage and a discharging voltage. In other words, the voltage across the inductor IN is reversed to maintain flow of current through the MOSFET device N1. In some embodiments, charging of the inductor IN can be terminated in response to the MOSFET device N1 being changed (e.g., changed by the controller 450) from the on-state to an off-state. In some embodiments, current discharge from the inductor IN to the MOSFET device N1 can be triggered in response to the MOSFET device N1 being changed from the on-state to an off-state. In some embodiments, delivery of current to the inductor IN from the power source 410 can be terminated when the flow of the current reaches a specified level.

Figure 6E:
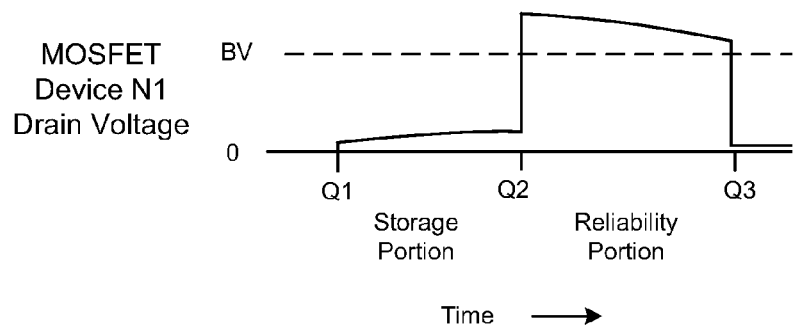

In response to current from the inductor IN being delivered to the MOSFET device N1 starting at approximately time Q2, a drain voltage of the MOSFET device N1 increases beyond a breakdown voltage BV of the MOSFET device N1 as shown in FIG. 6E. The drain voltage of the MOSFET device N1 remains above the breakdown voltage BV of the MOSFET device N1 until approximately time Q3. Accordingly, MOSFET device N1 can be in a breakdown state between times Q2 and Q3. At approximately time Q3, the drain voltage of the MOSFET device N1 drops in response to current from the inductor IN being depleted (e.g., discharged) (or substantially depleted) at approximately time Q3 as shown in FIG. 6B. In some embodiments, the breakdown voltage BV can be a projected (e.g., estimated, expected, or rated minimum) breakdown voltage of the MOSFET device N1 (which can be a MOSFET device with specified characteristics). In some embodiments, the breakdown voltage BV can be a rated breakdown voltage, a target breakdown voltage, or a measured breakdown voltage.

In some embodiments, the storage portion of the test cycle between times Q1 and Q2 can have a duration of between a few microseconds a few milliseconds. In some embodiments, the duration can be shorter than a few microseconds or longer than a few milliseconds. In some embodiments, the stress portion of the test cycle between times Q2 and Q3 can have a duration of between a few microseconds a few milliseconds. In some embodiments, the duration can be shorter than a few microseconds or longer than a few milliseconds.

Figure 6F:
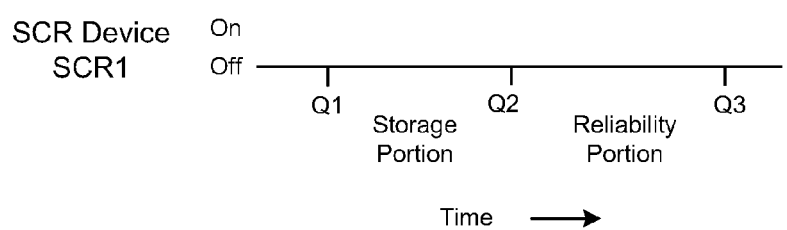
Figure 6G:
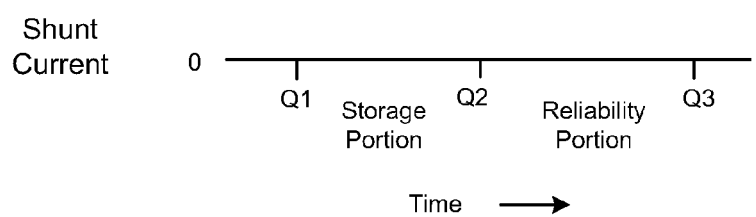

In this embodiment, current from the inductor IN is not shunted by the SCR device SCR1 as shown in FIG. 6F, and shunt current is not produced as shown in FIG. 6G. In some embodiments, a rise in the drain voltage of the MOSFET device N1 may not instantaneously rise after the MOSFET device N1 is turned off. In other words, there can be a delay (e.g., a 10 ns to 100 microsecond delay) between turning off the MOSFET device N1 and the rise in the drain voltage of the MOSFET device N1 in response to the inductor current IN. Accordingly, the SCR device SCR1 (and associated control) can be configured so that the SCR device SCR1 is not triggered in response to this delay.

FIGS. 7A through 7G are graphs that illustrate operation of the test system 400 shown in FIG. 4 when the target device 420 fails a reliability test implemented by the test system 400, according to an embodiment. A storage portion of the reliability test is performed before time R2 and a stress portion of the reliability test is performed after time R2. FIGS. 7A through 7G can illustrate, or be related to, a single cycle of the reliability test.

Figure 7A:
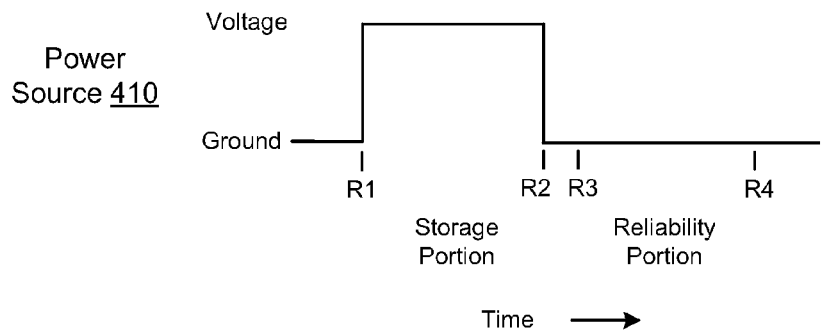
FIGS. 7A through 7G are graphs that illustrate operation of the test system shown in FIG. 4, according to another embodiment.
Figure 7B:
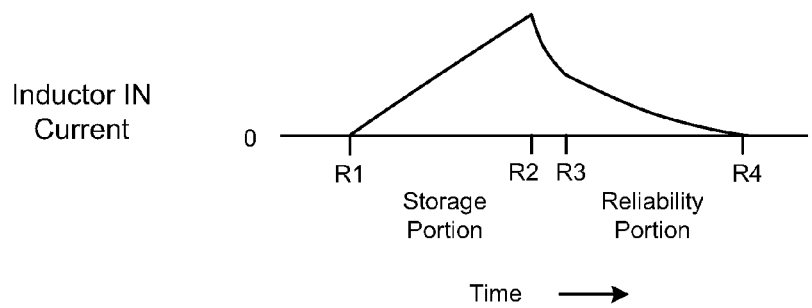
Figure 7C:
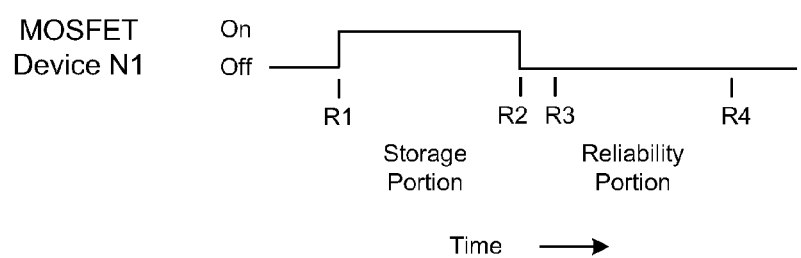
Figure 7D:
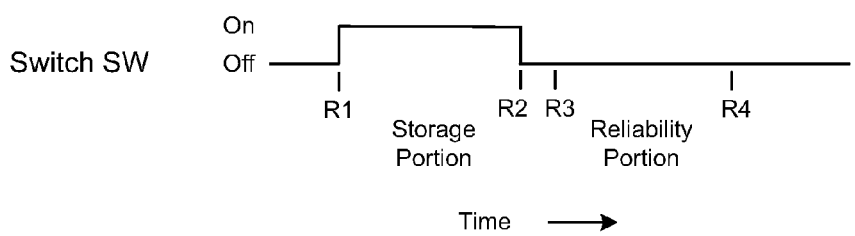

As shown in FIG. 7A, the power source 410 is configured to deliver, in conjunction with the switch SW shown in FIG. 7D, power starting at approximately time R1 and ending at approximately time R2. FIG. 7A illustrates a voltage (e.g., a voltage pulse) from the power source 410 (which can produce a voltage (e.g., a constant voltage, a relatively constant voltage) during the entire test cycle) shown at the output of the switch SW. In response to the voltage pulse, current stored in the inductor IN increases approximately linearly starting at time R1 until approximately the end of the voltage pulse at time R2 as shown in FIG. 7B. In other words, current is stored in the inductor IN between times R1 and R2 during the storage portion of the reliability test. In some embodiments, current may be stored in the inductor IN using energy having a different profile than the voltage pulse shown in FIG. 7A. In some embodiments, the ground voltage can be zero volts.

As shown in FIGS. 7C and 7D, the MOSFET device N1 and the switch SW, respectively, are changed from an off-state (e.g., an inactive state, an open state) to an on-state (e.g., an active state, an closed state) at approximately time R1. Both the MOSFET device N1 and the switch SW are changed from an off-state to an on-state so that energy associated with the voltage pulse of the power source 410 (shown in FIG. 7A) may be delivered to the inductor IN (shown in FIG. 7B). The switching can be implemented by (e.g., triggered by) the controller 450.

Starting at approximately time R2, current that was stored in the inductor IN during the storage portion of the reliability test is delivered from the inductor IN to the MOSFET device N1 during the stress portion of the reliability test. Accordingly, as shown in FIG. 7B, the current of the inductor IN decreases starting at approximately time R2 until the current is stored in the inductor IN is depleted (e.g., discharged, entirely depleted or discharged) at approximately time R4.

As shown in FIG. 7C, at approximately time R2, the MOSFET device N1 is change from the on-state to an off-state. Current that was delivered to the inductor IN and stored in the inductor IN will be delivered to the MOSFET device N1 while the MOSFET device N1 is in an off-state. In such embodiments, the voltage across the inductor IN may be changed between a charging voltage and a discharging voltage. In other words, the voltage cross the inductor IN is reversed to maintain flow of current through the MOSFET device N1. In some embodiments, charging of the inductor IN can be terminated in response to the MOSFET device N1 being changed (e.g., changed by the controller 450) from the on-state to an off-state. In some embodiments, current discharge from the inductor IN to the MOSFET device N1 can be triggered in response to the MOSFET device N1 being changed from the on-state to an off-state. In some embodiments, delivery of current to the inductor IN from the power source 410 can be terminated when the flow of the current reaches a specified level.

Figure 7E:
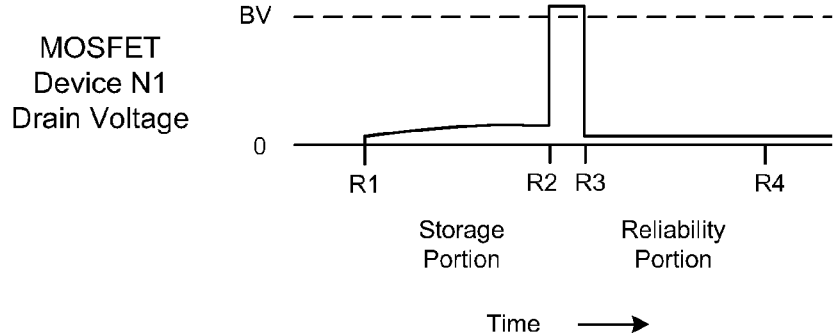

In response to current from the inductor IN being delivered to the MOSFET device N1 starting at approximately time R2, a drain voltage of the MOSFET device N1 increases beyond a breakdown voltage BV of the MOSFET device N1 as shown in FIG. 7E. Accordingly, MOSFET device N1 can be in a breakdown state starting at time R2. In some embodiments, the breakdown voltage BV can be a rated breakdown voltage, a target breakdown voltage, or a measured breakdown voltage.

In this embodiment, the MOSFET device N1 fails (e.g., fails short) at approximately time R3, and the drain voltage of the MOSFET device N1 drops (e.g., rapidly drops) below the breakdown voltage BV to a voltage at, or near zero. Accordingly, MOSFET device N1 can change from the breakdown state to a failure state starting at time R3. In some embodiments, the MOSFET device N1 can fail (e.g., fail short) in response to a defect in a gate oxide of the MOSFET device, a defect in a gate electrode MOSFET device, and/or so forth. In some embodiments, the breakdown voltage BV can be a projected (e.g., estimated) breakdown voltage of the MOSFET device N1 (which can be a MOSFET device with specified characteristics).

Figure 7F:
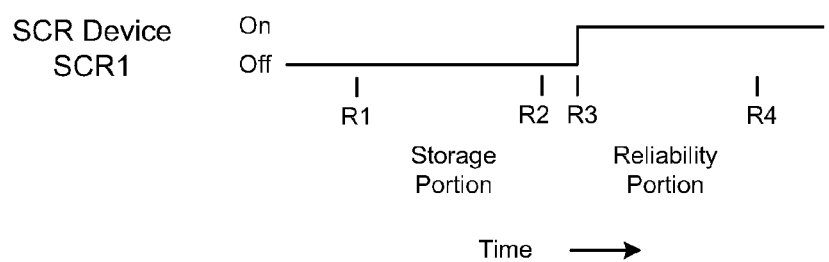
Figure 7G:
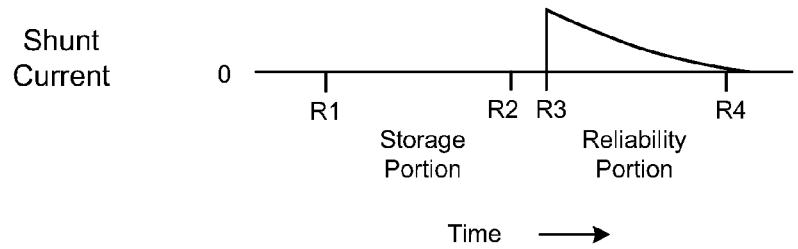

In response to the MOSFET device N1 failing (e.g., failing short), the SCR device SCR1 is changed from an off-state to an on-state as shown in FIG. 7F at approximately time R3. Instead of current being dissipated through the MOSFET device N1, current is shunted through the SCR device SCR1 and can be dissipated through the SCR device SCR1 (and/or another load). The current is shunted through the SCR device SCR1, as shown in FIG. 7G, until the current from the inductor IN is depleted at approximately time R4. In some embodiments, before the MOSFET device N1 fails (e.g., fails short), the SCR device SCR1 can be changed from an off-state to an on-state to perform shunting. In some embodiments, the triggered of the SCR device SCR1 can be delayed so that the MOSFET device N1 fails to a greater or lesser extent. In some embodiments, the triggering of the SCR device SCR1 can be delayed (e.g., delayed using a delay circuit) so that the MOSFET device N1 sinks current (while in a failed stated) for a specified period of time. In some embodiments, the delay can be inherent in the circuit (without the use of a delay circuit). In other words, the speed of the electronics or circuitry can dictate the duration of the delay without additional delay circuitry being introduced.

As shown in FIG. 7B, the current through the inductor IN deflects at approximately time R3 as current is shunted through the SCR device SCR1. The deflection can occur because the SCR device SCR1 can have a different resistance than the MOSFET device N1. In some embodiments, a trigger voltage of the SCR device SCR1 can have a specified threshold voltage value configured to trigger shunting when, for example, exceeded (e.g., exceeded by the drain voltage of MOSFET device N1) or when falling below (e.g., falling below the drain voltage of MOSFET device N1).

In this embodiment, the SCR device SCR1 can be changed from the off-state to the on-state in response to the drain voltage of the MOSFET device N1 falling below the breakdown voltage BV. In some embodiments, the SCR device SCR1 can be changed from the off-state to the on-state in response to the drain voltage of the MOSFET device N1 falling below the breakdown voltage BV for a specified (e.g., predefined) period of time (e.g., duration), after a specified (e.g., predefined) period of time (e.g., duration) of the MOSFET device N1 being turned off at time R2, and/or so forth. In some embodiments, the SCR device SCR1 can be changed from the off-state to the on-state in response to the drain voltage of the MOSFET device N1 falling below the breakdown voltage BV for a specified (e.g., predefined) period of time only after remaining above the breakdown voltage BV for a specified (e.g., predefined) period of time. In some embodiments, the SCR device SCR1 can be changed from the off-state to the on-state within a specified period of time (e.g., within a few microseconds) after the drain voltage of the MOSFET device N1 falls below the breakdown voltage BV. Although not shown, in some embodiments, the SCR device SCR1 can be changed from the off-state to the on-state in response to the drain voltage of the MOSFET device N1 falling below a voltage different from (e.g., higher than, lower than) the breakdown voltage BV.

In some embodiments, a rise in the drain voltage of the MOSFET device N1 may not instantaneously rise after the MOSFET device N1 is turned off. In other words, there can be a delay (e.g., a 10 ns to 100 microsecond delay) between turning off the MOSFET device N1 (at approximately time R2) and the rise in the drain voltage of the MOSFET device N1 (at approximately time R2) in response to the inductor current IN. Accordingly, the SCR device SCR1 (and associated control) can be configured so that the SCR device SCR1 is not triggered in response to this delay.

FIGS. 8A through 8G are graphs that illustrate operation of the test system 400 shown in FIG. 4 when the target device 420 fails a reliability test implemented by the test system 400, according to another embodiment. A storage portion of the reliability test is performed before time S2 and a stress portion of the reliability test is performed after time S2. FIGS. 8A through 8G can illustrate, or be related to, a single cycle of the reliability test.

Figure 8A:
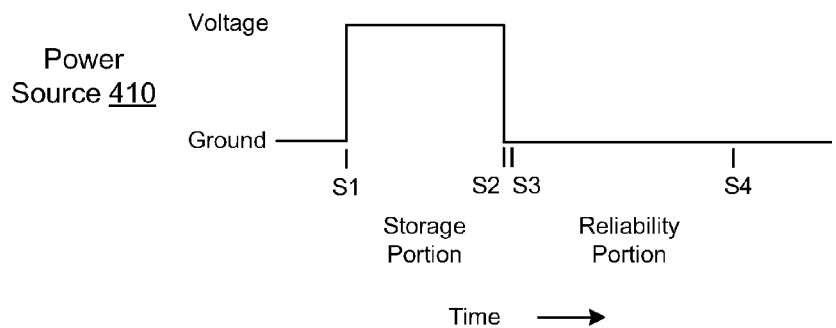
FIGS. 8A through 8G are graphs that illustrate operation of the test system shown in FIG. 4, according to yet another embodiment.
Figure 8B:
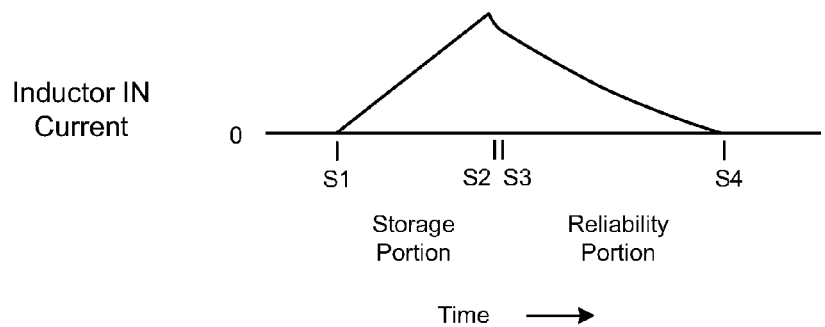
Figure 8C:
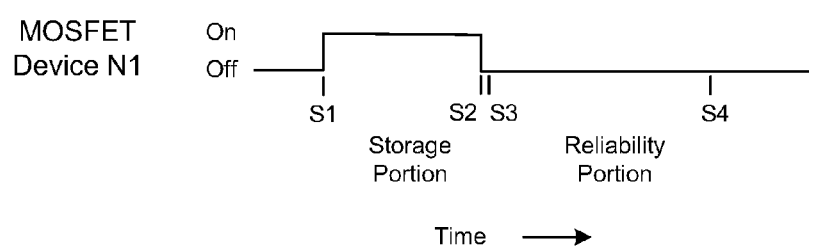
Figure 8D:
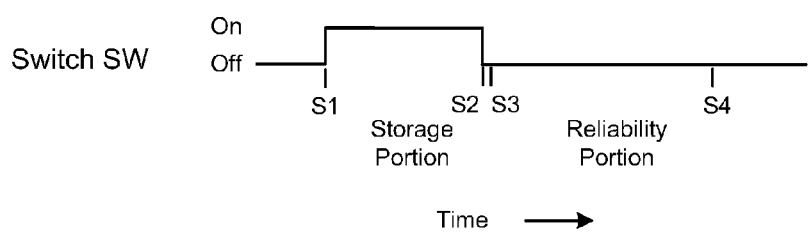

As shown in FIG. 8A, the power source 410 is configured to deliver, in conjunction with the switch SW shown in FIG. 8D, power starting at time S1 and ending at time S2. FIG. 8A is illustrates a voltage (e.g., a voltage pulse) from the power source 410 (which can produce a voltage (e.g., a constant voltage, a relatively constant voltage) during the entire test cycle) shown at the output of the switch SW. In response to the voltage pulse, current stored in the inductor IN increases approximately linearly starting at time S1 until approximately the end of the voltage pulse at time S2 as shown in FIG. 8B. In other words, current is stored in the inductor IN between times S1 and S2 during the storage portion of the reliability test. In some embodiments, current may be stored in the inductor IN using energy having a different profile than the voltage pulse shown in FIG. 8A. In some embodiments, the ground voltage can be zero volts.

As shown in FIGS. 8C and 8D, the MOSFET device N1 and the switch SW, respectively, are changed from an off-state (e.g., an inactive state, an open state) to an on-state (e.g., an active state, a closed state) at approximately time S1. Both the MOSFET device N1 and the switch SW are changed from an off-state to an on-state so that energy associated with the voltage pulse of the power source 410 (shown in FIG. 8A) may be delivered to the inductor IN (shown in FIG. 8B). The switching can be implemented by (e.g., triggered by) the controller 450.

Starting at approximately time S2, current that was stored in the inductor IN during the storage portion of the reliability test is delivered from the inductor IN to the MOSFET device N1 during the stress portion of the reliability test. Accordingly, as shown in FIG. 8B, the current of the inductor IN decreases starting at approximately time S2 until the current stored in the inductor IN is depleted (e.g., discharged, entirely depleted or discharged) at approximately time S4.

As shown in FIG. 8C, at approximately time S2, the MOSFET device N1 is changed from the on-state to an off-state. Current that was delivered to the inductor IN and stored in the inductor IN will be delivered to the MOSFET device N1 while the MOSFET device N1 is in an off-state. In such embodiments, the voltage across the inductor IN may be changed between a charging voltage and a discharging voltage. In other words, the voltage cross the inductor IN is reversed to maintain flow of current through the MOSFET device N1. In some embodiments, charging of the inductor IN can be terminated in response to the MOSFET device N1 being changed (e.g., changed by the controller 450) from the on-state to an off-state. In some embodiments, current discharge from the inductor IN to the MOSFET device N1 can be triggered in response to the MOSFET device N1 being changed from the on-state to an off-state. In some embodiments, delivery of current to the inductor IN from the power source 410 can be terminated when the flow of the current reaches a specified level.

Figure 8E:
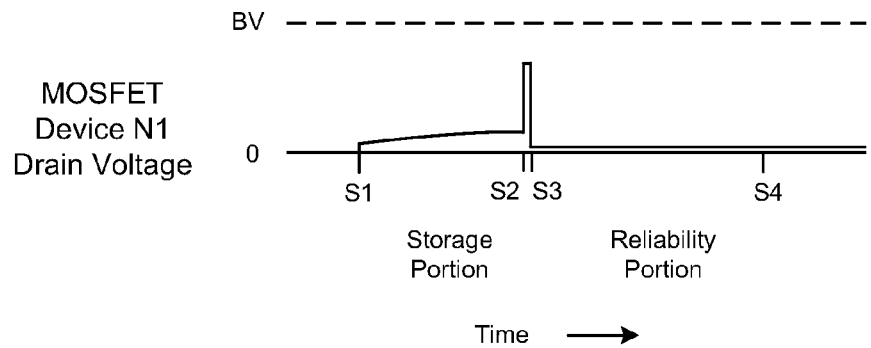

In response to current from the inductor IN being delivered to the MOSFET device N1 starting at approximately time S2, a drain voltage of the MOSFET device N1 increases, but remains below a breakdown voltage BV of the MOSFET device N1 as shown in FIG. 8E (from a time the gate of the MOSFET device turns off). In some embodiments, the MOSFET device N1 can fail to rise above the breakdown voltage BV due to, for example, a short caused by a defect in a gate oxide of the MOSFET device, a defect in a gate electrode MOSFET device, and/or so forth. Accordingly, MOSFET device N1 may not change to (or reach) a breakdown state, and may remain in (or be in) a failure state (e.g., a failed state) between times S2 and S3. In some embodiments, the breakdown voltage BV can be a projected (e.g., estimated) breakdown voltage of the MOSFET device N1 (which can be a MOSFET device with specified characteristics).

Figure 8F:
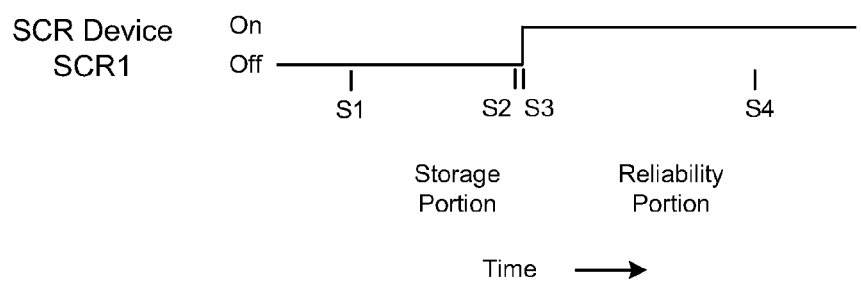
Figure 8G:
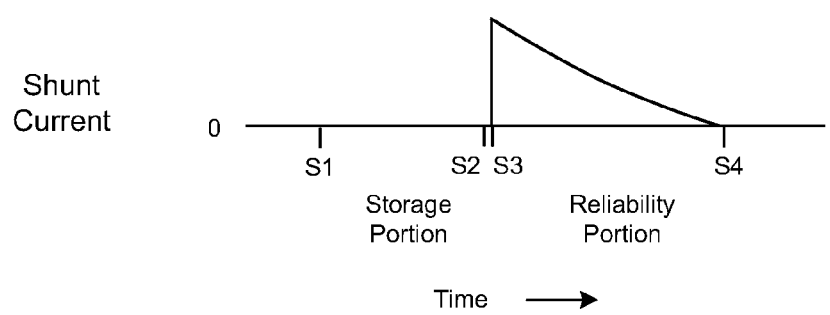

In response to the MOSFET device N1 failing (e.g., failing short), the SCR device SCR1 is changed from an off-state to an on-state as shown in FIG. 8F at approximately time S3. Instead of current being dissipated through the MOSFET device N1, current is shunted through the SCR device SCR1 and can be dissipated through the SCR device SCR1 (and/or another load). The current is shunted through the SCR device SCR1 as shown in FIG. 8G until the current from the inductor IN is depleted (e.g., discharged) at approximately time S4. In this embodiment, the MOSFET device N1 fails at approximately time S3, and the drain voltage of the MOSFET device N1 drops below the breakdown voltage BV to a voltage at, or near zero, as current is shunted away from the MOSFET device N1.

In some embodiments, before the MOSFET device N1 fails (e.g., fails short), the SCR device SCR1 can be changed from an off-state to an on-state to perform shunting. In some embodiments, the triggering of the SCR device SCR1 can be delayed so that the MOSFET device N1 fails to a greater or lesser extent. In some embodiments, the triggering of the SCR device SCR1 can be delayed so that the MOSFET device N1 sinks current (while in a failed stated) for a specified period of time.

As shown in FIG. 8B, the current through the inductor IN deflects at approximately time S3 as current is shunted through the SCR device SCR1. The deflection can occur because the SCR device SCR1 can have a different resistance than the MOSFET device N1. In some embodiments, a trigger voltage of the SCR device SCR1 can have a specified (e.g., predefined) threshold voltage value configured to trigger shunting when, for example, exceeded (e.g., exceeded by the drain voltage of MOSFET device N1) or when falling below (e.g., falling below the drain voltage of MOSFET device N1).

In this embodiment, the SCR device SCR1 can be changed from the off-state to the on-state in response to the drain voltage of the MOSFET device N1 failing to exceed the breakdown voltage BV. In some embodiments, the SCR device SCR1 can be changed from the off-state to the on-state in response to the drain voltage of the MOSFET device N1 failing to exceed the breakdown voltage BV within a specified (e.g., predefined) period of time (e.g., a specified period of time after the MOSFET device N1 is changed to an off state, a specified (e.g., predefined) period of time after the inductor IN starts delivering current to the MOSFET device N1), within a specified (e.g., predefined) period of time of the MOSFET device N1 being turned off at time S2, and/or so forth. Although not shown, in some embodiments, the SCR device SCR1 can be changed from the off-state to the on-state in response to the drain voltage of the MOSFET device N1 failing to exceed a voltage different from (e.g., higher than, lower than) the breakdown voltage BV.

In some embodiments, a rise in the drain voltage of the MOSFET device N1 may not instantaneously rise after the MOSFET device N1 is turned off. In other words, there can be a delay (e.g., a 10 ns to 100 microsecond delay) between turning off the MOSFET device N1 (at approximately time S2) and the rise in the drain voltage of the MOSFET device N1 (at approximately time S2) in response to the inductor current IN. Accordingly, the SCR device SCR1 (and associated control) can be configured so that the SCR device SCR1 (or shunting through the SCR device SCR1) is not triggered in response to this delay. In some embodiments, the delay can be between 10 nanoseconds (ns) and 100 ns. In some embodiments, the delay can be less than 100 ns. In some embodiments, the delay can be greater than 100 ns.

Although not shown in FIGS. 6D, 7D, and 8D, the switch SW can remain in the on-state throughout the reliability tests shown in FIGS. 6 through 8. In such instances, the power source 410 can include, or can be associated with, a switch configured to independently operate from switch SW so that the power source 410 can produce a power pulse (e.g., a voltage pulse). In some embodiments (and as shown in FIGS. 6D, 7D, and 8D), the switch SW may be changed from the on-state to the off-state at approximately the same time that the MOSFET device N1 is turned off (e.g., at time Q2, R2, S2). In some embodiments, the switch SW may be changed from the on-state to the off-state in response to the drain voltage of the MOSFET device N1 (shown in FIGS. 6E, 7E, and 7E) dropping. In other words, the switch SW may be changed from the on-state to the off-state in response to the current being shunted away from the MOSFET device N'. This can, for example, protect the power source 410 from damage.

Although the shunting in FIGS. 7D and 8D is triggered based on a drain voltage across the MOSFET device N1, in some embodiments, shunting can be triggered based on another parameter (e.g., a current, a voltage rate, an average value) associated with the MOSFET device N1, or another device within the test system 400. In some embodiments, a failing leakage current level (e.g., a gate current level) can be used to trigger shunting of current away from the MOSFET device N'. Also other devices in addition to, or in lieu of, a MOSFET device can be tested based on the techniques described in connection with FIGS. 6 through 8.

Implementations of the various techniques described herein may be implemented in electronic circuitry, on electronic circuit boards, in discrete components, in connectors, in modules, in electromechanical structures, or in combinations of them. Portions of methods also may be performed by, and an apparatus may be implemented as, or integrated into special purpose semiconductor circuitry (e.g., an FPGA (field programmable gate array) or an ASIC (application-specific integrated circuit)).

Implementations may be implemented in an electrical system including computers, automotive electronics, industrial electronics, portable electronics, telecom systems, mobile devices, and/or consumer electronics. Components may be interconnected by any form or medium of electronic communication (e.g., a communication network). Examples of communication networks include a local area network (LAN) and a wide area network (WAN), e.g., the Internet.

Some implementations of devices under test may include various semiconductor processing and/or packaging techniques. Some embodiments (e.g., devices under test and/or test system components) may be implemented using various types of semiconductor processing techniques associated with semiconductor substrates including, but not limited to, for example, Silicon (Si), Germanium (Ge), Silicon Germanium (SiGe), Gallium Arsenide (GaAs), Silicon Carbide (SiC), type III-V semiconductor substrates, type II-VI semiconductor substrates, and/or so forth.

As least some implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device (computer-readable medium), for processing by, or to control the operation of a data processing apparatus, e.g., a programmable processor, a computer, or multiple computers. Thus, a computer-readable storage medium can be configured to store instructions that when executed cause a processor (e.g., a processor at a host device, a processor at a client device) to perform a process. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as special purpose logic circuitry, e.g., an FPGA (field programmable gate array) or an ASIC (application-specific integrated circuit).

Processors suitable for the processing of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example, semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
an inductive storage device configured to discharge at least a portion of energy stored in the inductive storage device into a target device during a wafer level reliability test;
a monitoring module configured to receive an indicator of a voltage across the target device as the energy is discharging from the inductive storage device into the target device while the target device is in an off-state, the voltage being a drain voltage of the target device; and
a shunt controller configured to trigger shunting of at least a portion of the energy away from the target device in response to the indicator of the voltage being below a breakdown voltage and after a first predefined period of time of the target device being changed to the off-state, the shunt controller further configured to trigger shunting based on the voltage remaining below the breakdown voltage for longer than a second predefined period of time, the second predefined period of time being after the first predefined period of time.

2. The apparatus of claim 1, further comprising:
a storage controller configured to trigger delivery of energy from a power source to the inductive storage device before the discharge of at least a portion of the energy stored in the inductive storage device.

3. The apparatus of claim 1, wherein the inductive storage device, the monitoring module, and the shunt controller are integrated into a test board.

4. The apparatus of claim 1, wherein the breakdown voltage is a rated breakdown voltage.

5. An apparatus, comprising:
an energy storage device configured to store energy during an unclamped inductive switching test of a target device;
a monitoring module configured to receive an indicator of a voltage across the target device; and
a shunt controller configured to trigger a switch device, the switch device configured to shunt at least a portion of energy away from the target device in response to the target device changing from a breakdown state to a failure state, the shunt controller configured to identify the changing of the target device changing from the breakdown state to the failure state based on the voltage across the target device being above a breakdown voltage for a first predefined period of time and below the breakdown voltage for a second predefined period of time.

6. The apparatus of claim 5, wherein the energy is shunted after the target device has changed to the failure state.

7. The apparatus of claim 5, wherein the energy storage device is an inductive storage device, and the switch device includes a silicon-controlled rectifier (SCR) device.

8. The apparatus of claim 5, wherein the breakdown state is an avalanche breakdown state.

9. The apparatus of claim 5, wherein the breakdown voltage is a rated breakdown voltage.

10. An apparatus, comprising:
an energy storage device configured to discharge at least a portion of energy stored in the energy storage device into a target device during a wafer level reliability test;
a monitoring module configured to monitor an aspect of the target device as the energy is discharging from the energy storage device into the target device;
a shunt controller configured to identify changing of the target device from a breakdown state to a failure state based on a voltage across the target device being above a breakdown voltage for a first predefined period of time and below the breakdown voltage for a second predefined period of time, and
the shunt controller configured to shunt at least a portion of the energy away from the target device in response to the identification of the target device changing from a breakdown state to the failure state, the first predefined period of time corresponding to a time period between changing the target device to an off-state and a rise in a voltage of a drain node of the target device.

11. The apparatus of claim 10, wherein the wafer level reliability test is an unclamped inductive switching test.

12. The apparatus of claim 10, wherein the at least the portion of energy is introduced into the energy storage device via the target device when the target device is in an on-state, the shunting is performed while the target device is in the off-state.

13. The apparatus of claim 10, wherein the target device is a MOSFET device.

14. The apparatus of claim 10, wherein the shunting is performed after the voltage of the drain node of the target device exceeds a breakdown voltage of a body diode of the target device and after the voltage of the drain node of the target device falls below the breakdown voltage.

15. The apparatus of claim 10, wherein the target device is a MOSFET device, the aspect of the target device is the voltage at the drain node of the MOSFET device.

16. The apparatus of claim 10, wherein the shunt controller is configured to shunt before the voltage of the drain node of the target device exceeds an expected breakdown voltage of a body diode of the target device.

17. The apparatus of claim 10, wherein the shunt controller is configured to shunt so that a current through a probe coupled to the target device is below a current limit of the probe, the shunting is performed so that a current through the target device is decreased.

18. The apparatus of claim 10, wherein the shunt controller is configured to shunt via a silicon-controlled rectifier, and the energy storage device is an inductor.

19. The apparatus of claim 10, wherein the changing from the breakdown state to the failure state in response to at least a portion of the target device failing short.

20. The apparatus of claim 10, wherein the breakdown state is an avalanche breakdown state.

21. The apparatus of claim 10, wherein the breakdown voltage is a rated breakdown voltage.

22. An apparatus, comprising:
an energy storage device configured to transfer energy from the energy storage device into a target device during a wafer level reliability test;
a monitoring module configured to detect, during the wafer level reliability test, that the target device is changed from a breakdown state to a failure state based on a drain voltage of the target device being above a breakdown voltage for at least a first predefined period of time and falling below a voltage lower than a breakdown voltage of the target device for at least a second predefined period of time, the second predefined period of time being after the first predefined period of time; and
a shunt controller configured to trigger a decrease in a current through the target device in response to the detecting.

23. The apparatus of claim 22, wherein the detecting is based on at least one of a change in a voltage across or a change in a current into the target device.

24. The apparatus claim 22, wherein the wafer level reliability test is performed before the target device is extracted from a wafer as a die.

25. The apparatus of claim 22, wherein the breakdown voltage is a rated breakdown voltage.

26. The apparatus of claim 22, wherein the breakdown state is an avalanche breakdown state.

* * * * *

UNITED STATES PATENT AND TRADEMARK OFFICE
CERTIFICATE OF CORRECTION

| | |
|---|---|
| PATENT NO. | : 9,097,759 B2 |
| APPLICATION NO. | : 13/559048 |
| DATED | : August 4, 2015 |
| INVENTOR(S) | : Keller et al. |

Page 1 of 1

It is certified that error appears in the above-identified patent and that said Letters Patent is hereby corrected as shown below:

In the claims
Column 22, line 14, claim 19, delete "state in" and insert -- state is in --, therefor.

Signed and Sealed this
Second Day of February, 2016

Michelle K. Lee
*Director of the United States Patent and Trademark Office*